(12) United States Patent
Shindo

(10) Patent No.: US 7,122,928 B2
(45) Date of Patent: Oct. 17, 2006

(54) HOUSING FOR ELECTRONIC CIRCUIT

(75) Inventor: Yusuke Shindo, Owariasahi (JP)

(73) Assignee: Denso Corporation, Kariya (JP)

( * ) Notice: Subject to any disclaimer, the term of this patent is extended or adjusted under 35 U.S.C. 154(b) by 177 days.

(21) Appl. No.: 10/757,986

(22) Filed: Jan. 16, 2004

(65) Prior Publication Data

US 2004/0145860 A1 Jul. 29, 2004

(30) Foreign Application Priority Data

Jan. 20, 2003 (JP) ............................. 2003-010824

(51) Int. Cl.
| | |
|---|---|
| H02K 5/00 | (2006.01) |
| H02K 11/00 | (2006.01) |
| H02K 5/24 | (2006.01) |
| H02K 9/00 | (2006.01) |
| H02B 1/26 | (2006.01) |
| H02B 1/56 | (2006.01) |
| H05K 7/20 | (2006.01) |
| H05K 9/00 | (2006.01) |

(52) U.S. Cl. ............................ 310/89; 310/71; 310/51; 310/52; 361/624; 361/694; 361/818; 361/678

(58) Field of Classification Search ................ 361/624; 310/89
See application file for complete search history.

(56) References Cited

U.S. PATENT DOCUMENTS

| | | | | |
|---|---|---|---|---|
| 5,331,239 | A | * | 7/1994 | Kwun et al. .............. 310/68 R |
| 6,339,192 | B1 | | 1/2002 | Hashimoto |
| 6,543,918 | B1 | * | 4/2003 | Nagata ....................... 362/488 |
| 6,661,659 | B1 | * | 12/2003 | Tamba et al. ............... 361/699 |
| 6,707,185 | B1 | * | 3/2004 | Akutsu et al. ................ 310/71 |
| 7,009,318 | B1 | * | 3/2006 | Iritani et al. .................... 310/58 |
| 2001/0010977 | A1 | * | 8/2001 | Murakami ................. 439/76.2 |
| 2004/0003664 | A1 | * | 1/2004 | Ishikawa et al. .............. 73/644 |
| 2005/0223727 | A1 | * | 10/2005 | Funahashi et al. ......... 62/228.4 |

FOREIGN PATENT DOCUMENTS

| | | |
|---|---|---|
| JP | A-2000-159083 | 6/2000 |
| JP | A-2000-255252 | 9/2000 |

* cited by examiner

*Primary Examiner*—Lisa Lea-Edmonds
*Assistant Examiner*—Zachary Pape
(74) *Attorney, Agent, or Firm*—Posz Law Group, PLC

(57) ABSTRACT

A box unit is a housing having a space for containing a circuit board therein. Bus bars are insert-molded in a resin body of the box. A metal shield plate is insert-molded around the entire periphery of the box and outside the bus bars. As a result, the box has a shield and is reduced in size compared with a metal box.

12 Claims, 5 Drawing Sheets

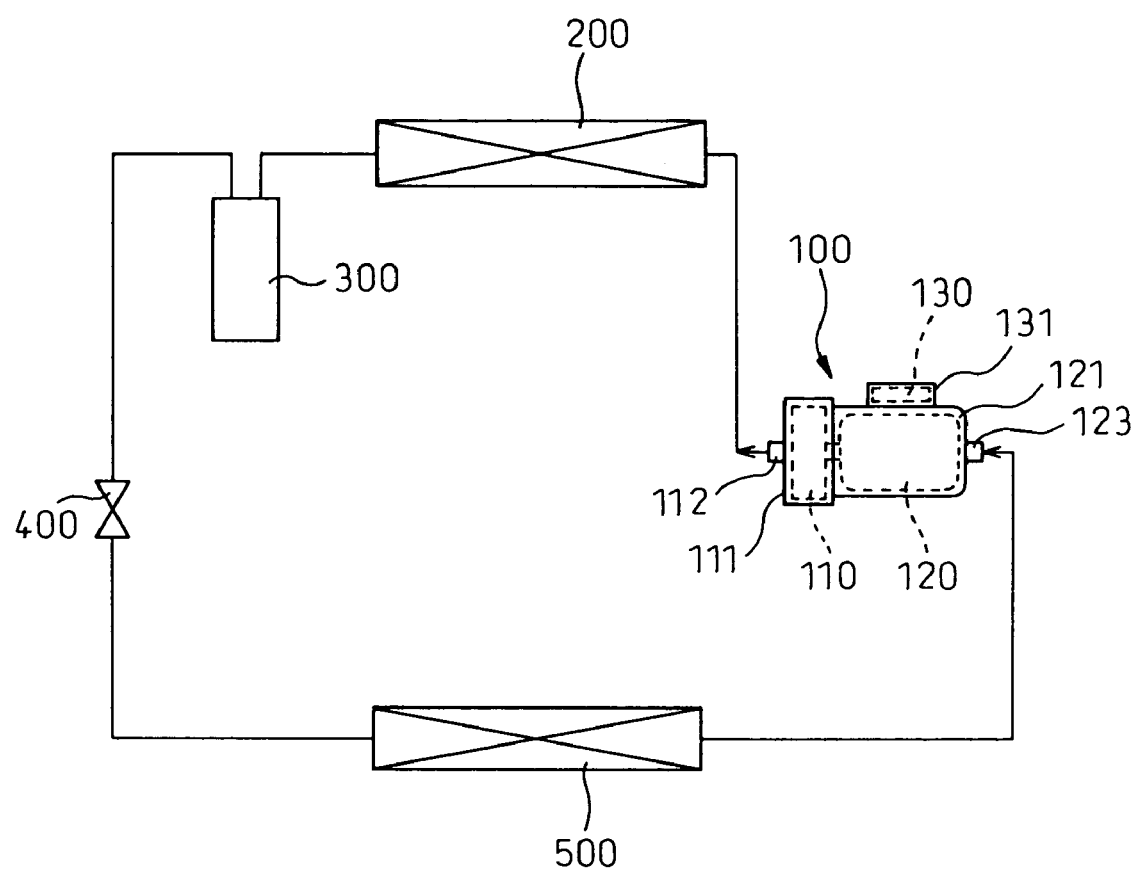

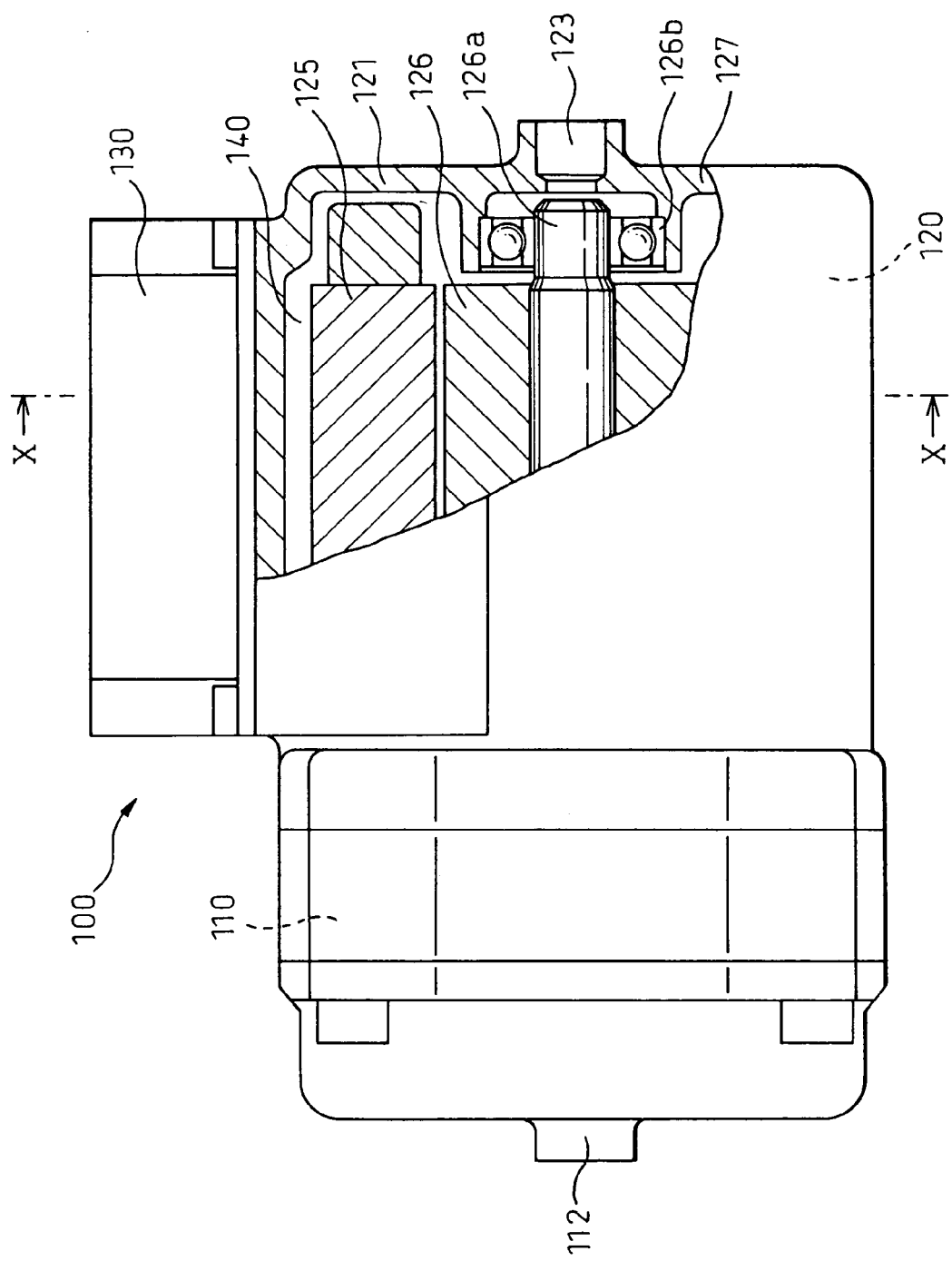

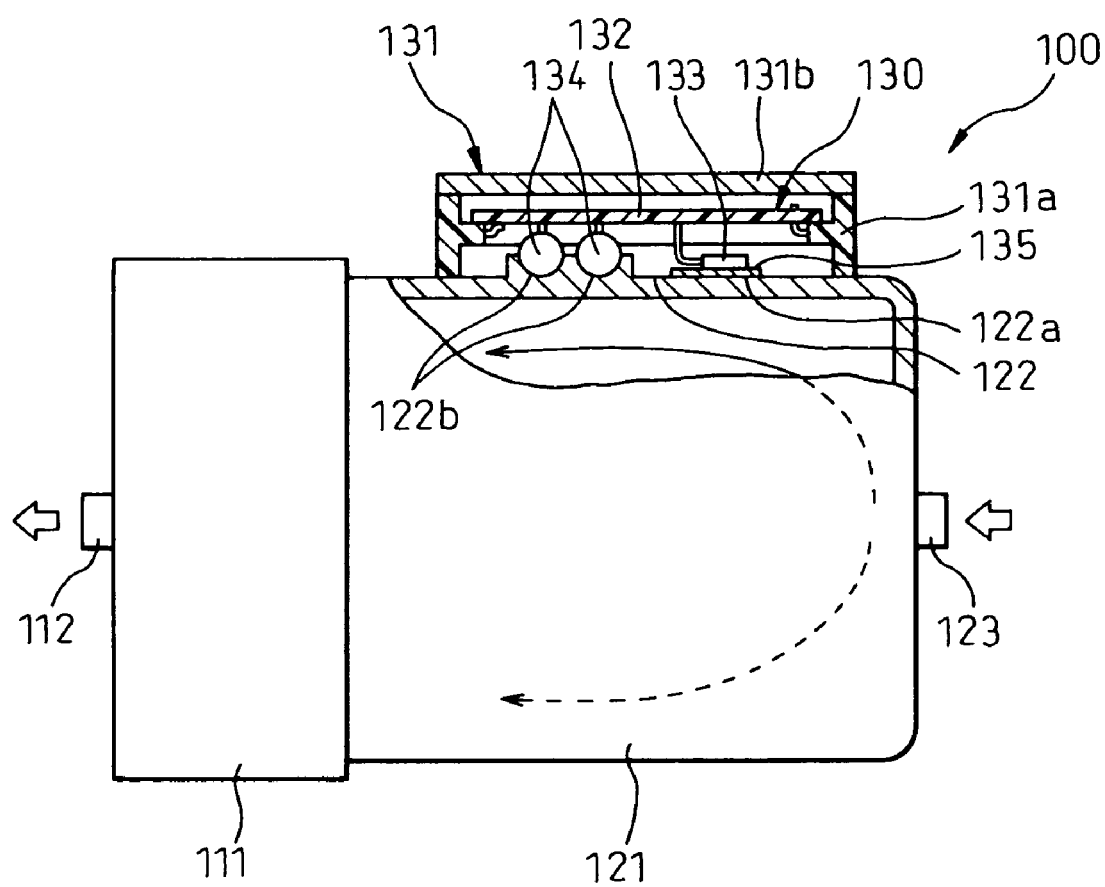

HOUSING FOR ELECTRONIC CIRCUIT

BACKGROUND OF THE INVENTION

1. Field of the Invention

The present invention relates to a resin housing for containing an electronic circuit and, more particularly, to a resin housing for containing a motor driving circuit for an electric compressor.

2. Description of the Related Art

A conventional electronic circuit housing is disclosed in Japanese Unexamined Patent Publication No. 2000-159083. This housing is illustrated as a resin housing having bus bars insert-molded therein for connecting the electronic circuit in it.

The conventional electronic circuit housing, however, being a resin housing, poses the problem that electromagnetic waves generated by the electronic circuit are radiated outside of the housing or an external electromagnetic noise is received by the electronic circuit in the housing.

An electronic circuit housing which is formed of a metal to cope with this problem can produce the effect of shielding an electromagnetic wave. As bus bars cannot be formed integrally with a conductive housing, however, the electronic circuit housing becomes undesirably bulky.

This invention has been obtained to solve the problems described above, and the object thereof is to provide an electronic circuit housing with bus bars, which has a compact size and has the effect of shielding electromagnetic waves.

SUMMARY OF THE INVENTION

In order to achieve the object described above, according to a first aspect of the present invention, an electronic circuit housing (131a), formed of a resin, having an internal space for containing an electronic circuit (130) comprises bus bars (600) that are insert-molded for connecting the electronic circuit (130) and a conductive plate (700) that is insert-molded to surround the space and arranged on the outer side of the bus bars.

The bus bars (600) are integrated by insert-molding with the resin electronic circuit housing (131a), and therefore the electronic circuit housing (131a) is not bulky. Also, as the conductive plate (700) is insert-molded in the resin electronic circuit housing (131a) in such a position as to surround the space for containing the electronic circuit (130), electromagnetic waves can be shielded.

The electronic circuit housing (131a) having the bus bars (600) can shield the electronic magnetic waves and avoid the bulkiness.

According to a second aspect of the invention, an electronic circuit housing has the conductive plate (700) that is a metal plate.

The metal plate can positively shield electromagnetic waves, and also can improve the rigidity of the electronic circuit housing (131a). Further, as a metal generally has a higher heat conductivity than resin, the electronic circuit (130) can be more easily cooled.

According to a third aspect of the invention, an electronic circuit housing has a conductive plate (700) that is connected to a member (121) at the ground potential.

This can shield electromagnetic waves more positively.

According to a fourth aspect of the invention, an electronic circuit housing has the electronic circuit (130) that is a motor driving circuit (130) for a motor (120) to drive a compression mechanism (110) of a electric compressor (100).

According to a fifth aspect of the invention, an electronic circuit housing has a conductive plate (700) that is in contact with the part of the electric compressor (100) in which the refrigerant sucked by the compression mechanism (110) flows That part of the electric compressor (100) in which the refrigerant sucked by the compression mechanism (110) flows is comparatively low in temperature. Therefore, the conductive plate (700) in contact with this part is easily cooled so that the electronic circuit (130) contained in the electronic circuit housing (131a) is cooled more easily.

The reference numerals in parentheses attached to the component parts represent an example of correspondence with specific means included in the embodiments described below.

BRIEF DESCRIPTION OF THE DRAWINGS

FIG. 1A is a schematic diagram showing a vapor compression refrigeration cycle using a electric compressor having a housing for an electronic circuit according to an embodiment of this invention.

FIG. 1B is a partial cross section showing an electric compressor.

FIG. 2 is a side view showing another partial cross section of a electric compressor.

DESCRIPTION OF THE PREFERRED EMBODIMENTS

Figure 1C:
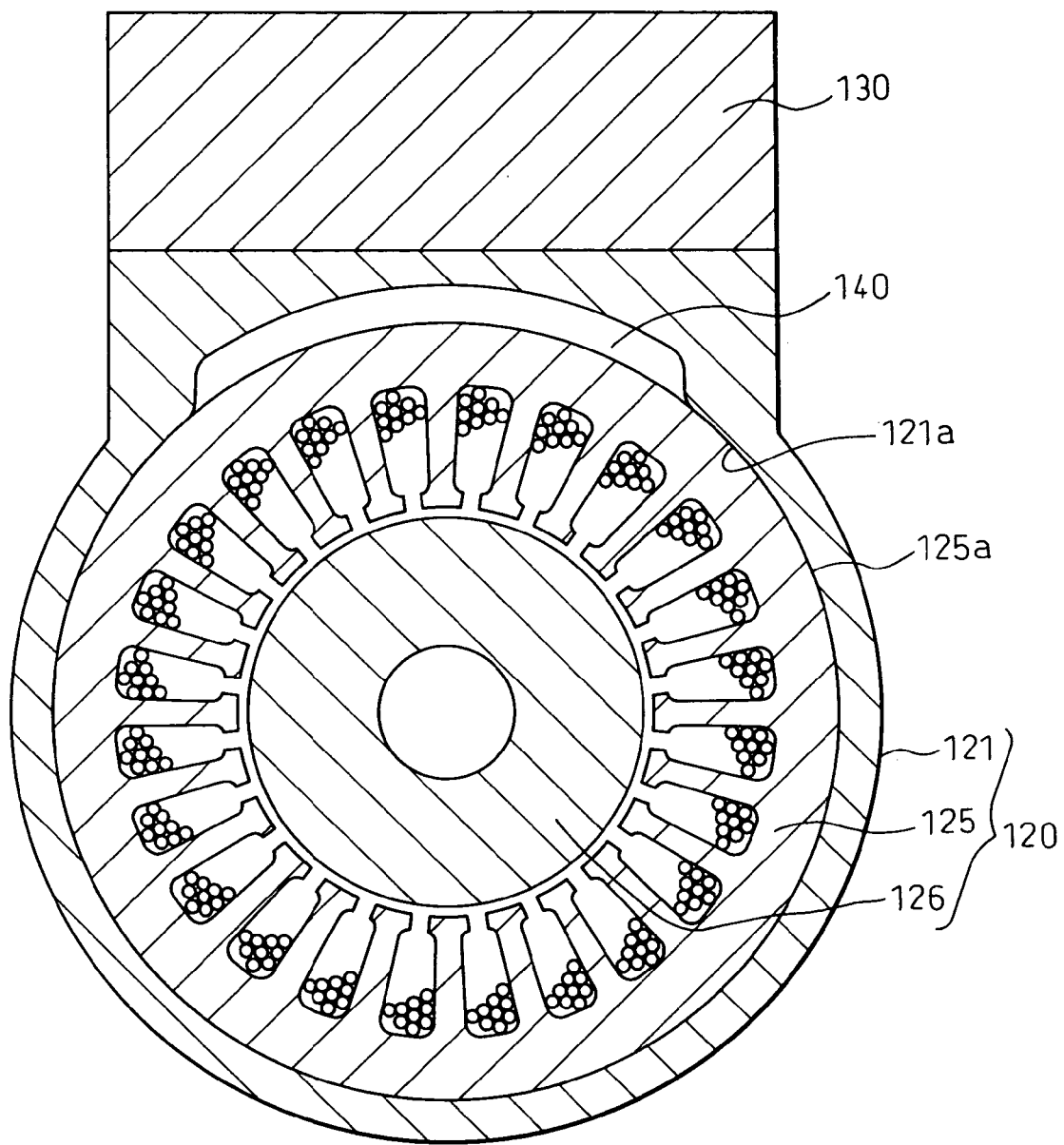
FIG. 1C is a cross-sectional view taken along line X—X in FIG. 1B.

FIG. 1A is a schematic diagram showing a vapor pressure compression refrigeration cycle for vehicles using a electric compressor 100 with a motor driving circuit having an electronic circuit housing according to this invention.

Reference numeral 200 designates a heat radiator (condenser) for cooling the refrigerant discharged from the compressor 100. Numeral 300 designates a receiver (gas-liquid separator) for separating the refrigerant flowing out of the heat radiator 200 into a gas-phase refrigerant and a liquid-phase refrigerant and supplying the liquid-phase refrigerant while at the same time storing extraneous refrigerant generated during the refrigeration cycle.

Numeral 400 designates an expansion valve constituting a pressure reducing means for reducing the pressure of the liquid-phase refrigerant that has flowed out of the receiver 300. Numeral 500 designates an evaporator for evaporating the refrigerant reduced in pressure by the expansion valve 400. Although this embodiment employs the expansion valve 400 as a pressure reducing means, the embodiment is not limited to the expansion valve 400, but may alternatively employ a fixed reduction valve as a pressure reducing means.

As shown in FIG. 1A, the compressor 100 includes a compression mechanism 110 (a scroll-type compression mechanism in this example) for sucking and compressing the refrigerant, an electric motor 120 (a brushless DC motor in this example) for driving the compression mechanism 110, and an inverter circuit 130 constituting a motor driving circuit for driving the motor 120.

Numeral 111 designates a housing of an aluminum alloy for containing the compression mechanism 110, and numeral 121 a motor housing of an aluminum alloy for containing the motor 120. The compression mechanism housing 111 and the motor housing 121 make up a housing of the compressor 100 according to this embodiment.

The motor housing 121, as shown in FIG. 1A, is formed with an intake port 123 connected to the refrigerant outlet side of the evaporator 500. The compression mechanism housing 111, on the other hand, is formed with an discharge port 112 connected to the refrigerant inlet side of the heat radiator 200, as shown in FIG. 1.

Numeral 131 designates a casing for containing the inverter circuit 130. The casing 131 is explained later.

The scroll-type compression mechanism 110 for rotating a rotary scroll with respect to a fixed scroll so that the volume of the working chamber is enlarged or reduced thereby to suck and compress the refrigerant. The fixed scroll is made as a part of the compression mechanism housing 111.

As shown in FIG. 1B, the electrical motor 120 includes a stator 125 press-fitted to the motor housing 121, and a rotor 126 rotatable in the stator 125. A part of the motor housing 121, except for the part where the electrical circuit 130 is assembled, is formed into an approximate cylindrical shape. One axial end of the motor housing 121 at a side opposite to the compression mechanism 110 is closed by a motor cover 127 to be integrated with the motor housing 121. A refrigerant inlet 124a is provided in the motor cover 127, and is coupled to a low-pressure side heat exchanger of the refrigerant cycle. Further, a shaft bearing 126b for rotatably supporting one side end of a shaft 126a of the rotor 126 is attached to the motor cover 124.

On the other hand, a discharge port 112 is provided in an axial end of the electrical compressor 100, at a side opposite to the motor cover 124. Therefore, refrigerant flows into the motor housing 121 from the refrigerant inlet 123, is compressed in the compression mechanism 110, and is discharged toward a high-pressure side heat exchanger of the refrigerant cycle from the discharge port 112.

As shown in FIG. 1C, a heat insulation portion 140 is provided between an inner wall 121a of the motor housing 121 and an outer wall 125a of the stator 125, at least at a circumference position corresponding to an integrated position where the electrical circuit 130 is integrated to the motor housing 121. By providing the heat insulation portion 140, heat transmission amount per unit time from the stator 125 to the electrical circuit 130 can be made smaller as compared with the other portion where the heat insulation portion 140 is not provided.

In the electrical compressor 100, the suction refrigerant having relative low temperature before being compressed in the compression mechanism 110 flows into the motor housing 121. Further, the space defining the heat insulation portion 140 has an opening area opened to an inlet passage of the refrigerant inlet 123. The opening area of the heat insulation portion 140 is made larger than that of a clearance between the stator 125 and the rotor 126, so that the low-temperature suction refrigerant tends to flow readily into the heat insulation portion 140 in the electrical motor 120. Accordingly, it can effectively restrict heat generated in the electrical motor portion 120 from being transmitted to the electrical circuit 130.

FIG. 2 is a side view showing a partial cross section of the compressor 100. In FIG. 2, the motor 120 and the terminal for supplying power to the motor 120 are not shown.

As shown in FIG. 2, a casing 131 including a box 131a and a cover 131b is arranged above the motor housing 121. The inverter circuit 130 constituting a motor driving circuit is arranged in the casing 131.

The inverter circuit 130 is configured of a circuit board 132 and electric devices mounted on the circuit board 132. In this example, only a power transistor 133 and capacitors 134 constituting main heat-generating devices are shown as electric devices mounted on the circuit board 132.

The box 131a has a structure in the shape of a substantially rectangular cylinder with a large opening in the upper and lower sides thereof. The bottom 122 of the interior (the space for containing the inverter circuit 130) of the box 131a is the outer surface of the motor housing 121.

As shown in FIG. 2, the power transistor 133 and the capacitors 134 with the terminals thereof connected to the circuit board 132 are in contact with the bottom 122 of the box 131a. The contact portion 122a contacted by the power transistor 133 is formed as a flat surface conforming with the shape of the lower surface of the power transistor 133. A heat conductive sheet 135 is arranged between the power transistor 133 and the contact portion 122a of the bottom 122, and the power transistor 133 is in contact with the contact portion 122a through the heat conductive sheet 135.

The heat conductive sheet 135 is formed of silicone rubber and filled with a non-conductive inorganic filler. The heat conductive sheet 135 has a dual function of a heat conductive member and an insulating member for electrically insulating the conductive portion of the power transistor 133 and the bottom 122 from each other.

The contact portions 122b contacted by the capacitors 134 are formed as grooves conforming with the shape of the lower surface of the capacitors 134. The capacitors 134 are in direct contact with the contact portions 122b. Nevertheless, a heat conductive sheet may be interposed between the capacitors 134 and the contact portions 122b as in the case of the power transistor 133.

Figure 3A:
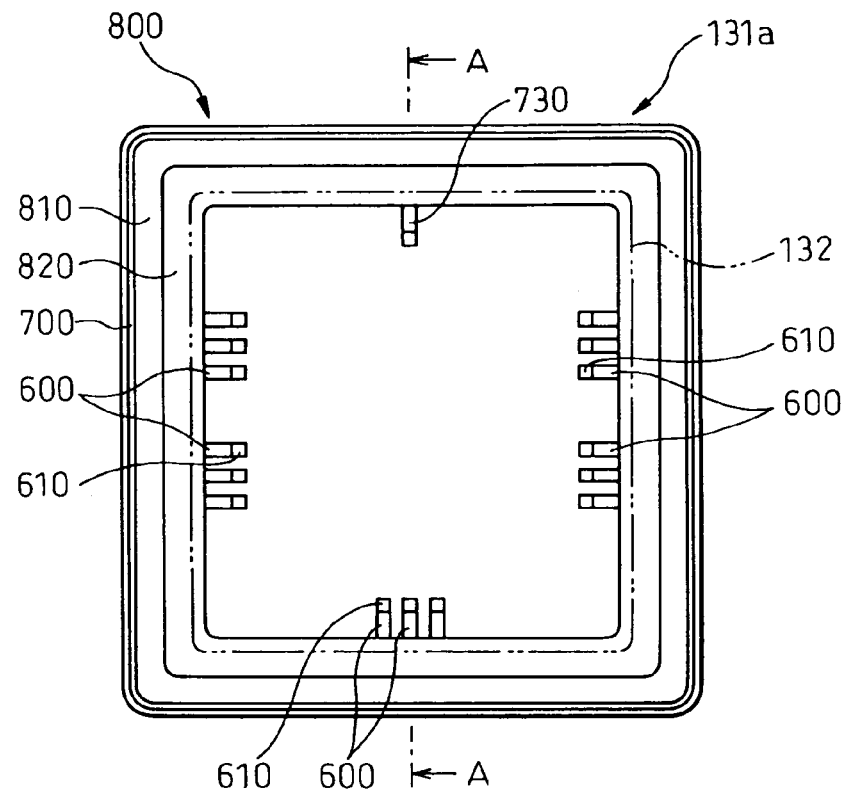
FIG. 3A is a plan view showing a box 131a constituting a housing for an electronic circuit.

The configuration of the box 131a making up an electronic circuit housing according to this embodiment will be explained. FIG. 3A is a plan view of the box 131a, and FIG. 3B a sectional view taken in line A—A in FIG. 3A.

The box 131a is formed of resin (polyphenylene sulfide in this example) in the shape of a substantially rectangular cylinder having upper and lower openings. A molded resin body 800 of the box 131a includes an outer cylinder 810 and a flat portion 820 expanded in the shape of a flange inward from the outer cylinder 810. Bus bars 600 constituting high-rigidity conductors are insert-molded as a large-current circuit pattern or the like in the resin body 810.

Figure 3B:
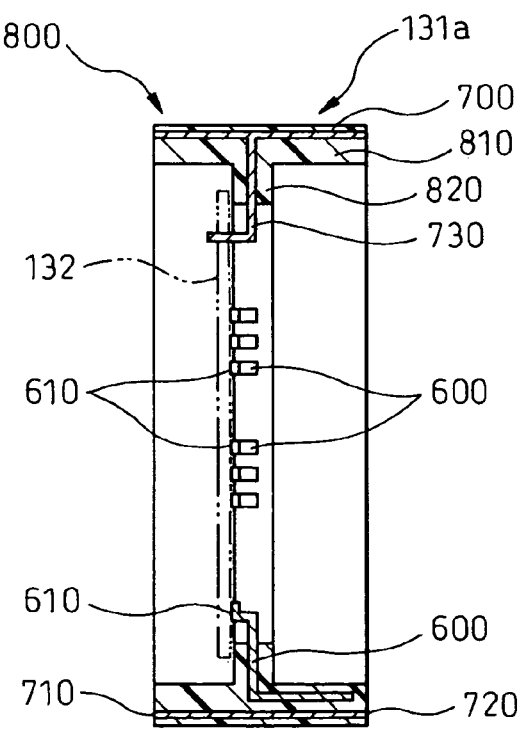
FIG. 3B is a sectional view taken along line A—A in FIG. 3A.

As shown in FIGS. 3A and 3B, the bus bars 600 insert-molded in the resin body 800 are partly exposed from the end of the flat portion 820. When the circuit board 132 is arranged in the position defined by a chain double-dashed line in FIG. 3, therefore, the connecting terminals 610 of the bus bars 600 are connected with the conductive pattern of the circuit board 132.

A metal shield plate 700 (corresponding to the conductive plate according to this invention) having a high conductivity (copper alloy in this example) is insert-molded in spaced relation with the bus bars 600 along the outer periphery of the inserted parts of the bus bars 600. The shield plate 700 has the shape of a substantially rectangular cylinder. The upper end surface 710 and the lower end surface 720 of the shield plate 700 are exposed over the entire periphery at the two end surfaces of the outer cylinder portion 810.

As shown in FIG. 3B, a grounding terminal 730 is formed in the inner surface of the shield plate 700. The end of the grounding terminal 730 protrudes from the end of the flat portion 820, so that, in the case where the circuit board 132 is arranged in the position defined by the chain double-dashed line in FIG. 3B, the grounding terminal 730 is connected with the ground pattern of the circuit board 132.

The box 131a having the configuration described above, together with a cover 131b, is assembled on the motor housing 121, thereby constituting the casing 131. In the assembly process, the box 131a is first screwed to the motor housing 121, wherein a seal (not shown) is arranged between the box and the housing. Next, the circuit board 132 with devices mounted thereon is inserted in the box 131a, and the connecting electrode of the conductor pattern is connected by solder or the like to the grounding terminal 730 and the connecting terminals 610 of the bus bars 600. Finally, the cover 131b of a metal plate (galvanized steel plate in this example) is screwed to the box 131a, wherein a seal (not shown) is arranged between the cover and the box.

As a result, the bus bars 600 are connected with, and integrated as a part of, the inverter circuit 130. At the same time, the ground pattern of the circuit board 132 is connected with the shield plate 700 through the grounding terminal 730. Also, the upper end surface 710 of the shield plate 700 is connected with the cover 131b, and the lower end surface 720 of the shield plate 700 is connected with the motor housing 121.

If the electric compressor 100 is mounted on the vehicle, the motor housing 121 is arranged on the metal body of the vehicle and constitutes a member at a ground potential. Thus, the shield plate 700, the cover 131b and the circuit board 132 connected through the grounding terminal 730 to the shield plate 700 are at a ground potential.

When assembling the casing 131, though not shown in figures, a sealant is interposed between the upper end 710 of the shield plate 700 and the cover 131b, and between the lower end of the shield plate 700 and the motor housing 121, and placed in a position not interfering with their electrical conductivity. The external connecting means such as a terminal is not shown in FIG. 3.

Next, the operation of the compressor 100 having the configuration described above is explained.

The motor 120 of the compressor 100, driven by the power supplied from the inverter circuit 130, drives the compression mechanism 110 coupled to the motor 120 and the refrigerant is sucked into the compression mechanism 110. At the same time, a low-temperature refrigerant in gas phase (suction refrigerant) flows in by way of the intake port 123. The refrigerant that has flowed in by way of the intake port 123, after passing through the motor housing 121 while cooling the motor 120, is sucked in and compressed by the compression mechanism 110 and discharged from the discharge port 112 in the form of a high-temperature refrigerant gas.

As long as power is fed to the motor 120 from the inverter circuit 130, electromagnetic waves are generated by the inverter circuit 130 including the bus bars 600. The inverter circuit 130 including the bus bars 600, however, is arranged in the space defined by a configuration including the shield plate 700, the cover 131b and the motor housing 121 (a configuration including the conductive members electrically connected to each other) in the box 131a.

The electromagnetic waves generated by the circuit 130 are thus shielded by the component members described above and the external radiation thereof is suppressed. The external electromagnetic waves are also shielded and the entry thereof into the inverter circuit 130, including the bus bars 600, is suppressed.

Part of the suction refrigerant sucked by the compression mechanism 110 that goes to the compression mechanism 110 from the intake port 123 flows in the upper part in the motor housing 121, as shown in FIG. 2. This suction refrigerant absorbs the heat from the power transistor 133 and the capacitors 134, as the main heat sources of the inverter circuit 130, through the motor housing 121, while at the same time cooling the internal space of the casing 131 through the motor housing 121 and the shield plate 700. Thus, the inverter circuit 130 is efficiently cooled.

Also, the circuit board 132 holding the inverter circuit 130 is connected to the shield plate 700 by the grounding terminal 730, and therefore the inverter circuit 130 is also cooled by the heat transfer through the grounding terminal 730.

In the configuration and operation described above, the box 131a is formed by insert-molding the bus bars 600 in the resin body 800. As compared with a case where the box is formed of a metal, therefore, the box 131a can be reduced in size and weight. Also, as the shield plate 700 is inserted in the resin body 800 of the box 131a, electromagnetic waves can be shielded by the shield plate 700, which together with the cover 131b and the motor housing 121, surrounds the inverter circuit 130 including the bus bars 600. As a result, the box 131a having the bus bars 600 is prevented from becoming bulky while at the same time securing a high ability to shield electromagnetic waves.

This effect of shielding the electromagnetic waves prevents the electromagnetic waves generated by the inverter circuit 130 from affecting the adjoining devices on the one hand and the external electromagnetic wave from entering the inverter circuit 130 and affecting the electric compressor 100 on the other hand.

The shield plate 700, the cover 131b and the motor housing 121 forming the shield structure are electrically connected each other and ground. Therefore, the electromagnetic waves can be positively shielded.

Also, as the shield plate 700 is formed of a metal, the rigidity of the box 131a is improved as compared with a box formed of resin alone.

Further, the inverter circuit 130 can be positively cooled by the suction refrigerant flowing in the motor housing 121.

This is due to the fact that the shield plate 700 and the cover 131b, formed of a metal high in heat conductivity, are connected to the motor housing 121 that can be cooled by the suction refrigerant and quickly reach a low temperature. Therefore, the space where the inverter circuit 130 is arranged is easily cooled. The inverter circuit 130 can also be cooled by the heat transfer through the grounding terminal 730.

Furthermore, the heat-generating devices including the power transistor 133 and the capacitors 134 are in contact with the bottom of the casing 131 (the outer surface of the motor housing 121) on the one hand and the contact portions 122a and 122b of the power transistor 133 and the capacitors 134 are formed in the shape conforming with the respective devices. Thus, a larger contact area is secured for heat radiation, thereby contributing to an improved cooling performance.

Also, the power transistor 133 is in contact with the contact portion 122a of the bottom 122 of the casing 131 through the heat conductive sheet 135. Therefore, heat is radiated satisfactorily from the power transistor 133, and the conductive portion of the power transistor 133 is positively insulated from the casing 131.

The outer surface of the motor housing 121 constitutes the bottom 122 of the casing 131 for containing the inverter circuit 130. In other words, a part of the motor housing 121 is used also as the bottom of the casing 131. Thus, the size of the compressor 100 is reduced.

Further, the improved cooling performance of the inverter circuit 130 or, especially, that of the heat-generating devices eliminates the need of employing heat-generating devices having an unnecessarily high heat resistance. Thus, the compressor 100 is reduced in size by eliminating the need of large devices which generally have a high heat resistance.

According to this embodiment, the casing 131 is formed on the outer surface of the motor housing 121. The inverter circuit 130 can also be cooled, however, in the case where the casing 131 containing the inverter circuit 130 is formed on the outer surface of the part of the compression mechanism housing 111 where the suction refrigerant flows. Nevertheless, the structure according to this embodiment has the advantage that the motor 120 and the inverter 130 for driving the motor 120 can be arranged in proximity to each other and therefore the compressor 100 is reduced in size.

(Other Embodiments)

In the embodiment described above, the shield plate 700 is insert-molded in the resin body 800 of the box 131a. The invention is applicable to any case, however, in which the shield plate 700 is insert-molded in such a position as to surround the inverter circuit 130 including the bus bars 60. The shield plate 700 may be insert-molded, for example, on the outer surface of the resin body 800 with equal effect.

Unlike the embodiment described above having the shield plate of a metal, a conductive plate of a conductive material other than metal may be employed as long as the box has a sufficient heat conductivity and rigidity.

The casing 131, which is configured of the box 131a and the cover 131b in the embodiment described above, may alternatively be formed integrally as a resin mold and have the shield plate insert-molded in such a manner as to cover the internal space of the casing 131.

Although the box 131a and the cover 131b are assembled by screws in the embodiment described above, other engaging means may be employed with equal effect.

In the embodiment described above, the casing 131 is formed on the upper part of the motor housing 121 shown in FIG. 2. Nevertheless, the casing 131 may be formed alternatively on the the right part in FIG. 2.

Instead of arranging the inverter circuit 130 in the internal space of the casing 131 as in the embodiment described above, the internal space of the casing 131 may be potted with silicon gel or the like to secure insulation and waterproofness.

The contact portions 122a, 122b, which are formed to the shape of the lower surface of the devices in contact therewith in the embodiment described above, may alternatively be contacted by the upper surface as well as the lower surface of the devices.

According to the embodiments described above, the power transistor 133 and the capacitor 134 are in contact with the bottom 122 in the casing 131. Nevertheless, devices other than the power transistor 133 and the capacitors 134 may also be in contact with the bottom surface 122.

Unlike in the embodiment described above, which employs the heat conductive sheet 135 as a heat conductive member and an insulating member, silicon gel or the like may alternatively be used. In the case where the heat conductive sheet is not required to have the insulating function, a sheet containing a conductive filler may be employed.

The compression mechanism 110 is not limited to the scroll type employed in the embodiment described above, but may be of a vane type or a swash-plate controlled type. Also, the discharge port 122 and the intake port 123 may be located at any positions other than the positions specified in the embodiment described above, as long as the suction refrigerant flows in the motor housing 121.

Also, the motor 120 is not limited to a brushless DC motor as in the embodiment described above, but may be an AC motor or the like. Further, the motor driving circuit may not be of an inverter type as in the embodiment described above, but may alternatively be so configured that a DC motor is driven by using a chopper.

In the embodiment described above, the electronic circuit is a motor drive circuit for a motor to drive the electric compressor. However, the invention is also applicable a wide variety of housings for containing other electronic circuits.

What is claimed is:

1. An electronic circuit housing having an internal space for containing an electronic circuit, comprising:
    a circuit housing, the housing being formed of a resin;
    an electronic circuit;
    bus bars that are insert-molded in said circuit housing for connecting to the electronic circuit; and
    a conductive plate that is insert-molded in said circuit housing surrounding said space and arranged on an outer side of said bus bars;
    a metal cover;
    a metal motor housing;
    wherein the electronic circuit is a motor drivin circuit for a motor; and
    wherein the circuit housing defines an internal space by walls surrounding the internal space, the circuit housing having an upper end on which the metal cover is provided and a lower end where the metal motor housing is placed; and
    wherein said conductive plate is insert-molded in all the surrounding walls.

2. An electronic circuit housing according to claim 1, wherein said conductive plate is a metal plate.

3. An electronic circuit housing according to claim 1, wherein said conductive plate is connected to a ground member.

4. An electronic circuit housing according to claim 1, wherein said electronic circuit is a motor driving circuit for a motor to operate a compression mechanism of an electric compressor.

5. An electronic circuit housing according to claim 4, wherein said conductive plate is in contact with a part of said electric compressor in which a refrigerant, sucked in by said compression mechanism, flows.

6. An electronic circuit housing according to claim 1, wherein a shape of the housing is a rectangular cylinder having an upper opening and a lower opening.

7. An electronic circuit housing according to claim 6, wherein the metal cover is disposed to cover the upper opening, the conductive plate is exposed at the upper end of the circuit housing, and the metal cover is arranged to contact the conductive plate.

8. An electronic circuit housing according to claim 1, wherein the circuit housing includes an outer cylinder and a flange portion extending inward from the outer cylinder, wherein the bus bars are insert molded in the outer cylinder and the flange portion, and wherein the bus bars are partly exposed from the end of the flange portion.

9. An electronic circuit housing according to claim 1, wherein the cylindrical shape of the housing is a rectangular cylinder.

10. An electronic circuit housing formed of a resin having an internal space for containing an electronic circuit, wherein the electronic circuit is a motor driving circuit for a motor, comprising:

a circuit housing, the circuit housing being formed of a resin and having a cylindrical shape with an upper opening and a lower opening;

bus bars that are insert-molded in said circuit housing and adapted for connecting to the electronic circuit; and a conductive plate that is insert-molded in said circuit housing surrounding said space, arranged on the outer side of said bus bars, and conducted to a member at ground potential;

a metal cover;

a metal motor housing;

wherein the circuit housing defines an internal space by walls surrounding the internal space, the circuit housing having an upper end at the upper opening on which the metal cover is provided and a lower end at the lower opening where the metal motor housing is placed;

wherein said conductive plate is insert-molded in all the surrounding walls, and wherein the metal cover is disposed to cover the upper opening, the conductive plate is exposed at the upper end of the circuit housing, and the metal cover is arranged to contact the conductive plate.

11. An electronic circuit housing according to claim 10, wherein said conductive plate is in contact with a part of an electric compressor in which a refrigerant, sucked in by a compression mechanism, flows.

12. An electronic circuit housing according to claim 10, wherein the circuit housing includes an outer cylinder and a flange portion extending inward from the outer cylinder, wherein the bus bars are insert molded in the outer cylinder and the flange portion, and wherein the bus bars are partly exposed from the end of the flange portion.

* * * * *